(12) United States Patent
Hagiwara et al.

(10) Patent No.: US 7,576,340 B2
(45) Date of Patent: Aug. 18, 2009

(54) FOCUSED ION BEAM PROCESSING METHOD

(75) Inventors: Ryoji Hagiwara, Chiba (JP); Yasuhiko Sugiyama, Chiba (JP); Tomokazu Kozakai, Chiba (JP)

(73) Assignee: SII Nano Technology Inc., Chiba (JP)

( * ) Notice: Subject to any disclaimer, the term of this patent is extended or adjusted under 35 U.S.C. 154(b) by 242 days.

(21) Appl. No.: 11/542,434

(22) Filed: Oct. 3, 2006

(65) Prior Publication Data

US 2007/0158590 A1 Jul. 12, 2007

(30) Foreign Application Priority Data

Oct. 3, 2005 (JP) .............................. 2005-289717

(51) Int. Cl.
*H01J 37/30* (2006.01)
*H01J 37/244* (2006.01)

(52) U.S. Cl. .............................. 250/492.21; 250/492.2; 250/309; 250/310; 250/396 R; 250/397; 250/398

(58) Field of Classification Search ............ 250/492.21, 250/492.2, 309, 310, 396 R, 397, 398
See application file for complete search history.

(56) References Cited

U.S. PATENT DOCUMENTS 5,591,970 A * 1/1997 Komano et al. .............. 250/309
6,303,932 B1 * 10/2001 Hamamura et al. ......... 250/309

FOREIGN PATENT DOCUMENTS

JP 2001-006605 1/2001

OTHER PUBLICATIONS

R. Hagiwara et al., "Advanced FIB mask repair technology for ArF lithography," Photomask and Next-Generation Lighography Mask Technology VIII, Hiroichi Kawahira, Editor, Proceedings of SPIE vol. 4409, 2001.

* cited by examiner

*Primary Examiner*—Nikita Wells
(74) *Attorney, Agent, or Firm*—Brinks Hofer Gilson & Lione (57) ABSTRACT

There is provided a focused ion beam processing method in which damage to a workpiece is minimized when the surface of the workpiece is irradiated and processed with an ion beam. The method comprises the steps of: generating an acceleration voltage between an ion source and a workpiece; focusing an ion beam emitted from the ion source; and applying the ion beam to a predetermined process position to process the surface of the workpiece. In this process, the energy level of the ion beam produced by the acceleration voltage is set within a range from at least 1 keV to less than 20 keV.

10 Claims, 5 Drawing Sheets

CALCULATED Ga CONCENTRATION AFTER 64 SEC BEAM IRRADIATION

FOCUSED ION BEAM PROCESSING METHOD

This application claims priority under 35 U.S.C. §119 to Japanese Patent Application No. JP2005-289717 filed Oct. 3, 2005, the entire content of which is hereby incorporated by reference.

BACKGROUND OF THE INVENTION

1. Field of the Invention

The present invention relates to a focused ion beam processing method in which a focused ion beam is applied to microstructures such as new materials, semiconductor devices, photomasks, X-ray masks, storage devices, and magnetic heads for processing or observation thereof.

2. Description of the Related Art

Figure 7:
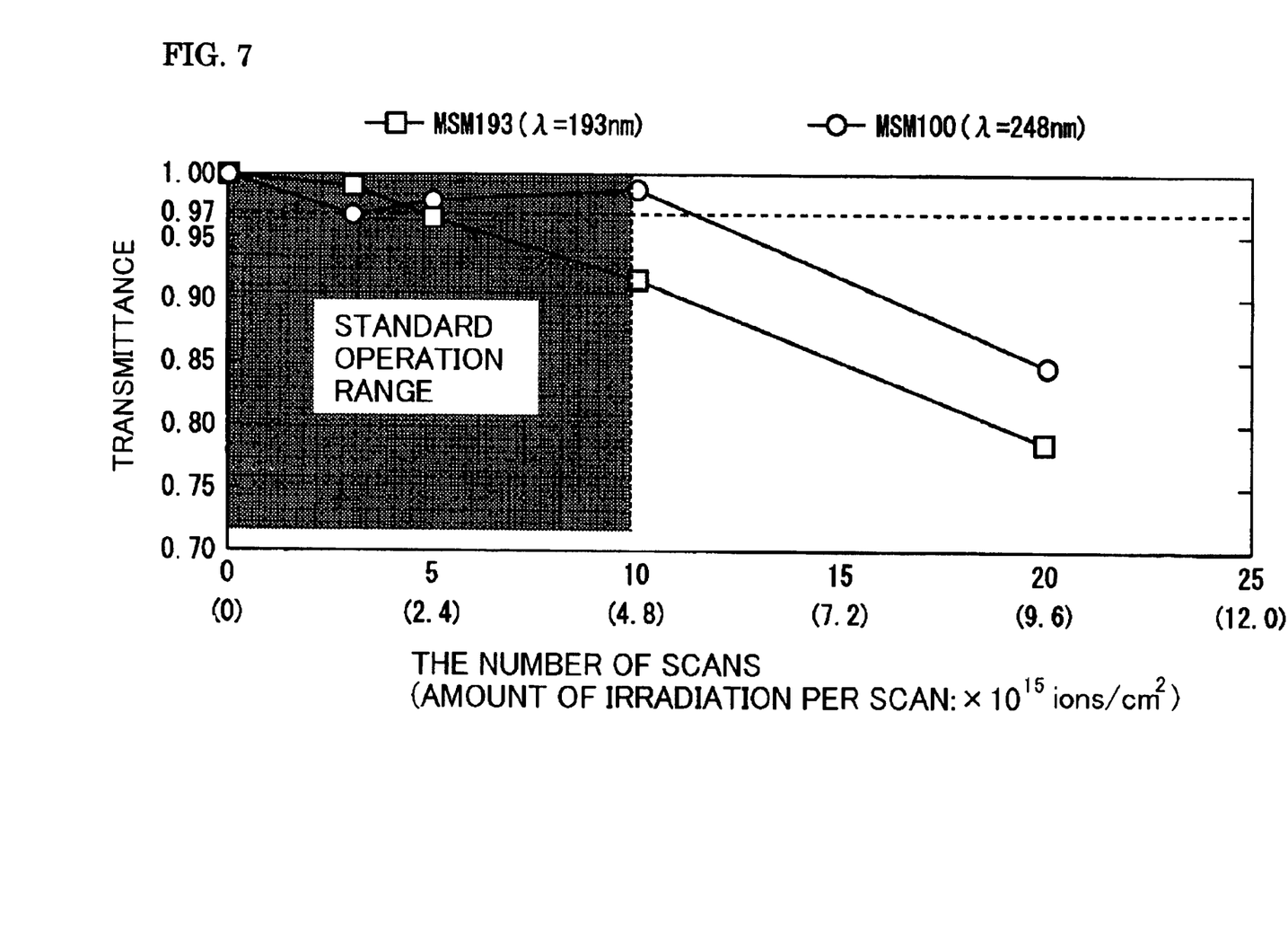
FIG. 7 shows graphs illustrating the relationship between the number of laser light irradiation and transmittance.

Conventionally, to repair a transmissive photomask, the location to be repaired is irradiated with a focused ion beam for processing. To improve processability, the focused ion beam is at an energy level of about 30 keV and has a beam diameter of 30 nm or smaller for nanometer processing in a quick and highly precise manner (see, for example, JP-A-2001-6605). In recent years, however, there has been a problem that an irradiated object, such as a transmissive photomask, gets damaged through irradiation of the focused ion beam. There has been reported a problem in repairing a transmissive photomask, that is, ions of the focused ion beam that penetrate a transmissive layer (SiO2, for example) during irradiation reduce the transmittance of irradiation light to be applied in a transfer process. In a mask process in semiconductor manufacturing, there has been proposed a method, as one of the solutions to this problem, in which the surface processed by the focused ion beam is washed to remove the damaged transmissive layer with a depth of 25 nm or deeper from the surface. According to this method, as shown in FIG. 7, it has been reported that 97% or greater of transmittance of the transmissive photomask after repair can be obtained for the laser light with a wavelength of 248 nm or greater, which has been conventionally employed in the transfer process, under a standard operating range (the number of scans is ten) (see, for example, Ryoji Hagiwara et al., Proc. of SPIE, "Advanced FIB mask repair technology for ArF lithography", (USA), 2001, No. 4069, page 555). Thus, a transmissive photomask is repaired with a focused ion beam and used in a patterning process for a linewidth of 90 nm or greater that can be transferred by laser light with a wavelength of 248 nm or greater.

In recent years, as the size of structures in semiconductor manufacturing has been increasingly reduced, developments of photolithography technologies for transferring linewidth in a range less than 90 nm are being pushed forward and studies are being carried out to investigate the use of laser light with a wavelength shorter than 248 nm (for example, 193 nm-laser light emitted from a medium made of ArF) as laser light to be applied. However, according to the non-patent document 1, as shown in FIG. 7, the above-mentioned method for repairing a transmissive photomask does not contribute to sufficient improvement in transmittance of laser light with a wavelength less than 248 nm, and the repaired portion may unfortunately be transferred in the transfer process in semiconductor manufacturing. Even when laser light with a wavelength of 248 nm or greater is used, the removal of the damaged portion of 25 nm or greater by washing reduces the thickness of the transmissive layer, resulting in a change in phase angle of applied laser light by 20 degrees or greater. Consequently, in a phase-effect mask utilizing a phase effect, mutual laser light interference unfortunately reduces the intensity of applied laser light. Such a problem of damaged portion formation due to a focused ion beam also applies to a reflective mask in which irradiation light (EUV) is reflected for the purpose of transfer. That is, when an absorption layer of a reflective mask is repaired with a focused ion beam, the reflectance of a reflection layer is unfortunately reduced.

The invention has been made in view of above situations and provides a focused ion beam processing method in which the surface of a workpiece is irradiated with the ion beam and processed with minimum damage to the workpiece.

SUMMARY OF THE INVENTION

To solve the above problems, the invention proposes the following measures: The invention provides a focused ion beam processing method comprising the steps of: generating an acceleration voltage between an ion source and a workpiece; focusing an ion beam emitted from the ion source; and applying the ion beam a predetermined process position to process the surface of the workpiece, the method characterized in that the energy level of the ion beam produced by the acceleration voltage is set within a range from at least 1 keV to less than 20 keV.

In the focused ion beam processing method according to the invention, by setting the energy level of the ion beam within a range of at least 1 keV to less than 20 keV, the depth of ion penetration into the workpiece can be reduced and a damaged portion due to ion beam irradiation may not reach a deeper part of the workpiece.

In the above focused ion beam processing method, it may be preferable that while the ion beam is applied to the process position, an assist gas is sprayed thereto.

In the focused ion beam processing method according to the invention, as the assist gas can facilitate the process performed by the ion beam, the amount of irradiation of the ion beam can be reduced. Thus, damage to the workpiece due to ion beam irradiation may be further reduced.

In the above focused ion beam processing method, it may be more preferable that the method further comprises the step of, after the process position is irradiated with the ion beam, washing a damaged portion of the workpiece into which ions of the ion beam has penetrated.

In the focused ion beam processing method according to the invention, the damaged portion into which ions of the ion beam has penetrated can be removed in the washing process. Since the depth of ion penetration can be reduced as described above, the thickness of the damaged portion to be removed can be minimized in this process.

Another embodiment of the invention is the focused ion beam processing method, characterized in that the workpiece is a transmissive photomask that includes a transmissive layer and a light-blocking layer patterned on the transmissive layer, and transmits and transfers irradiation light applied to portions other than the portions on which the light-blocking layer is patterned, and the light-blocking layer is repaired.

In the focused ion beam processing method according to the invention, when a repair location (process position) of the light-blocking layer is irradiated with the ion beam for processing, damage to the underlying transmissive layer can be minimized, thereby preventing reduction in transmittance of the transmissive layer. Thus, the repaired transmissive photomask can be used with irradiation light with a short wavelength, allowing a line with a reduced width to be transferred.

Another embodiment of the invention is the focused ion beam processing method, characterized in that the workpiece is a reflective mask that includes a reflective layer, an interference layer on the reflective layer and an absorption layer patterned on the interference layer, and reflects and transfers irradiation light applied to portions other than the portions on which the absorption layer is patterned, and the absorption layer is repaired.

In the focused ion beam processing method according to the invention, when a repair location (process position) of the absorption layer is irradiated with the ion beam for processing, damage due to the ion beam can be limited to the underlying interference layer of the absorption layer and ions of the ion beam are prevented from penetrating into the reflective layer, thereby preventing reduction in reflectance. Thus, the repaired reflective mask can be used with irradiation light with a short wavelength, allowing a line with a reduced width to be transferred.

The above focused ion beam processing method is further characterized in that the wavelength of the irradiation light with which the workpiece is irradiated and transferred is from at least 13.5 nm to less than 248 nm.

The focused ion beam processing method according to the invention can prevent reduction in transmittance of the transmissive layer of the transmissive photomask, or reduction in reflectance of the reflective layer of the reflective mask. Therefore, these masks can be used with irradiation light with a short wavelength, which is from at least 13.5 nm to less than 248 nm, without any problem.

According to the focused ion beam processing method of the invention, when a workpiece is irradiated with an ion beam, ions are prevented from penetrating into the workpiece, so that damage to the workpiece can be minimized. For example, in repairing a transmissive photomask, reduction in transmittance can be avoided, while in repairing a reflective mask, reduction in reflectance can be avoided. Thus, even when irradiation light with a short wavelength is used, impact of the process can be minimized, allowing patterning of a line with a width narrower than or equal to 65 nm.

DETAILED DESCRIPTION OF THE PREFERRED EMBODIMENT

First Embodiment

Figure 1:
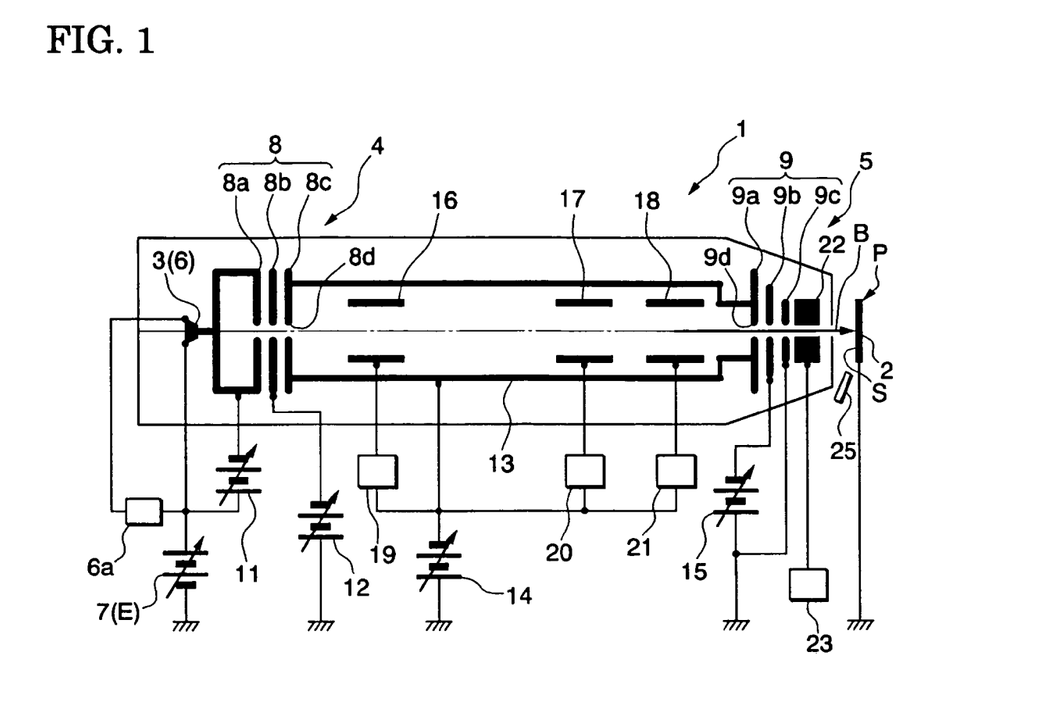
FIG. 1 is a block diagram showing the focused ion beam apparatus according to the first embodiment of the invention.
Figure 2:
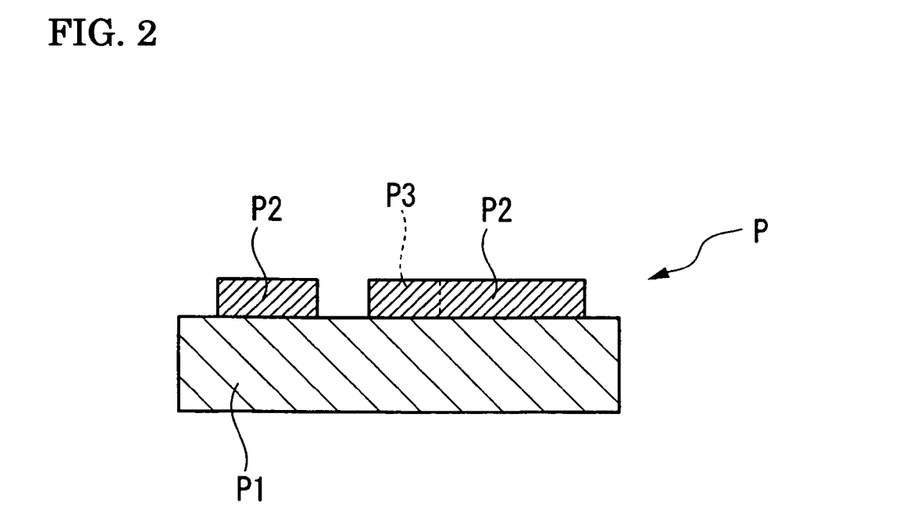
FIG. 2 is a cross-sectional view of the transmissive photomask according to the first embodiment of the invention.
Figure 3:
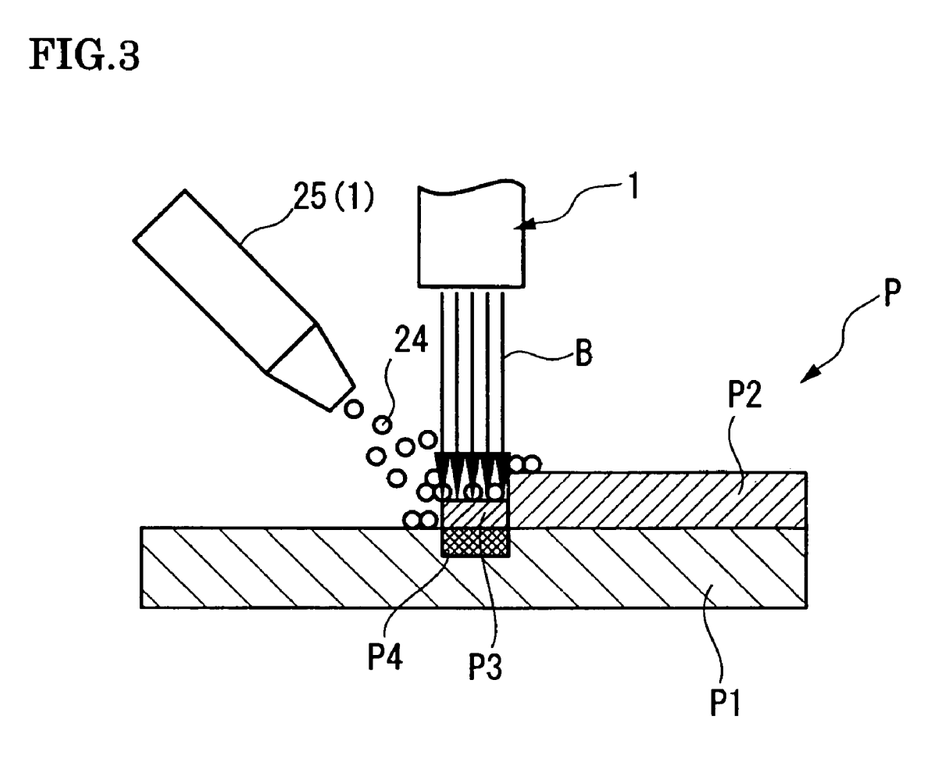
FIG. 3 is a view for explaining how the transmissive photomask is irradiated with the ion beam from the focused ion beam apparatus according to the first embodiment of the invention.
Figure 4:
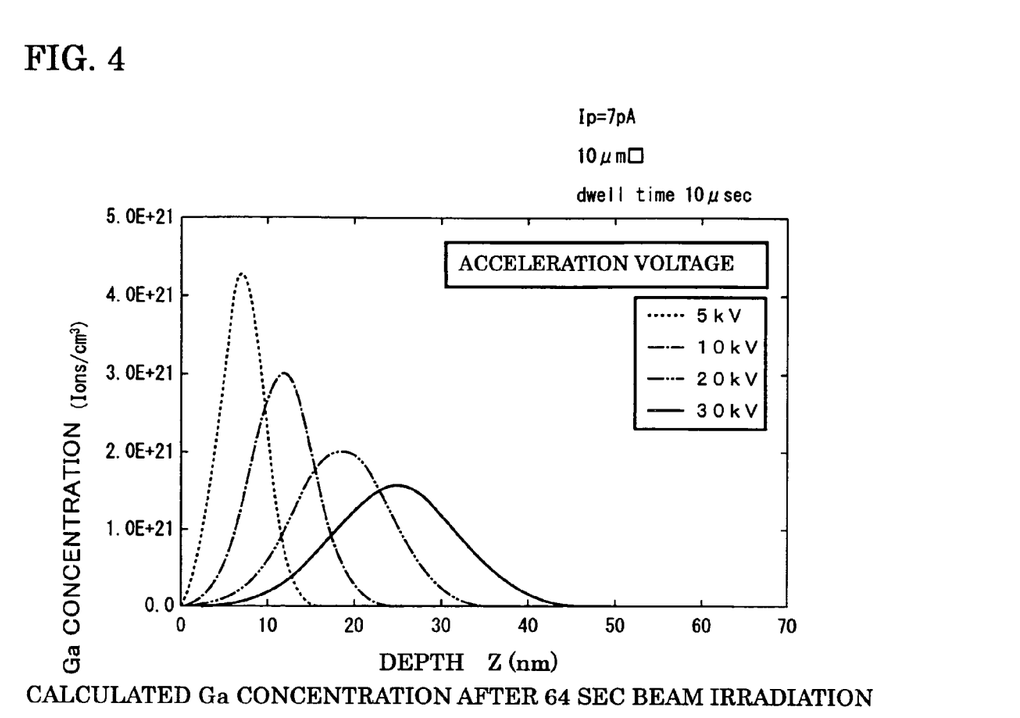
FIG. 4 shows graphs illustrating the relationship between the depth of a damaged portion of a workpiece and the concentration of ions when the workpiece is irradiated with ion beams with various energy levels according to the first embodiment of the invention.
Figure 5:
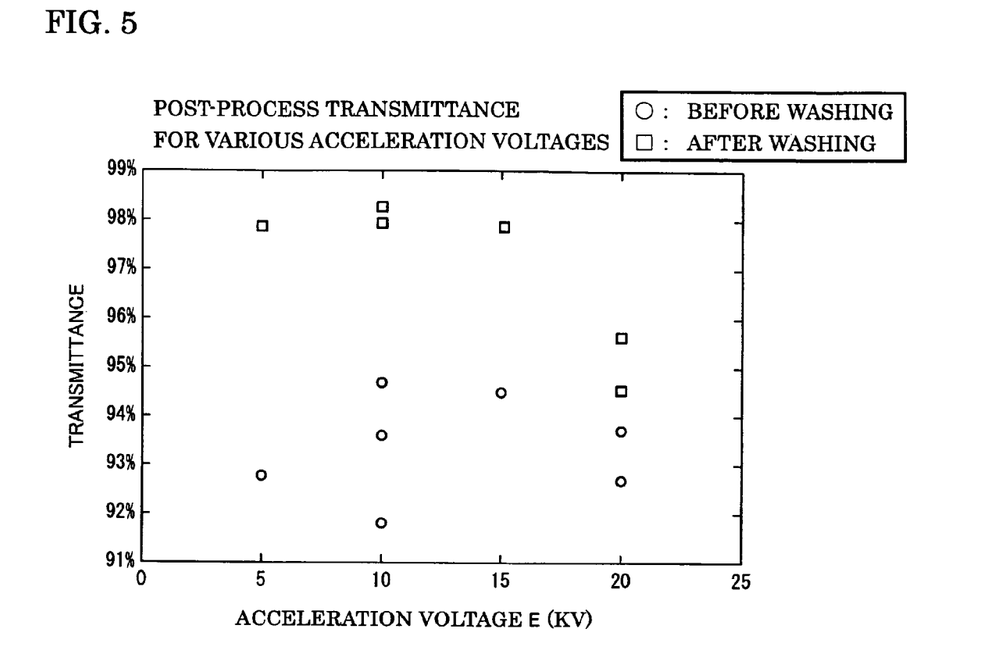
FIG. 5 shows graphs illustrating the relationship between the energy level of ion beam irradiation and the post-irradiation transmittance of the transmissive photomask before and after a washing process according to the first embodiment of the invention.

FIGS. 1 to 5 show a first embodiment according to the invention. FIG. 1 shows the configuration of a focused ion beam apparatus. FIG. 2 is a cross-sectional view of a transmissive photomask. FIG. 3 explains how the transmissive photomask is irradiated with the ion beam from the focused ion beam apparatus. FIG. 4 shows graphs illustrating the relationship between the depth of a damaged portion of a workpiece and the concentration of ions when the workpiece is irradiated with ion beams with various energy levels. FIG. 5 shows graphs illustrating the relationship between the energy level of ion beam irradiation and the post-irradiation transmittance of the transmissive photomask before and after a washing process.

As shown in FIG. 1, the focused ion beam apparatus 1 includes a workpiece mount 2 on which a transmissive photomask P, which is a workpiece, is mounted, an ion supply 3 that supplies an ion beam B with which the surface S of the transmissive photomask P is irradiated, acceleration means 4 that extracts and accelerates the ion beam B from the ion supply 3, and focusing means 5 that decelerates and focuses the ion beam B accelerated by the acceleration means 4. As shown in FIG. 2, the transmissive photomask P is formed of a transmissive layer P1 that transmits laser light irradiation (irradiation light) and a light-blocking layer P2 that is patterned on the transmissive layer P1 and blocks the laser light irradiation. More specifically, the transmissive layer P1 is, for example, quartz glass, and the light-blocking layer P2 is, for example, a film made of metal, such as chromium, or a thin film largely made of inorganic material, such as molybdenum silicide. As shown in FIG. 1, the transmissive photomask P is grounded when mounted on the workpiece mount 2.

As shown in FIG. 1, the ion supply 3 is provided with an ion source 6. The ion source 6 is, for example, liquid gallium and provided with a filament (not shown), which is connected to a filament power supply 6a. Thus, the ion source 6 is heated by the filament and always kept in its liquid state. Therefore, electrical potential difference around the ion source 6 can cause the ion source 6 to emit gallium ions ($Ga^+$), which becomes the ion beam B. Furthermore, the ion supply 3 is connected to a voltage-adjustable acceleration power supply 7, which applies a positive acceleration voltage E to the ion supply 3.

The acceleration means 4 and the focusing means 5 are provided with a first bi-potential lens 8 and a second bi-potential lens 9, respectively. The first bi-potential lens 8 and second bi-potential lens 9 have entrance electrodes 8a, 9a, intermediate electrodes 8b, 9b, and exit electrodes 8c, 9c, respectively. Each set of the entrance electrode, intermediate electrode, and exit electrode is serially arranged, and different voltages can be applied to the electrodes. That is, as shown in FIG. 1, the entrance electrode 8a of the first bi-potential lens 8 is connected to the cathode of a voltage-adjustable drawing power supply 11, and the intermediate electrode 8b is connected to the cathode of a voltage-adjustable condenser lens power supply 12. The exit electrode 8c of the first bi-potential lens 8 and the entrance electrode 9a of the second bi-potential lens 9 are connected via an electrically conductive intermediate acceleration tube 13, which is connected to the cathode of a voltage-adjustable intermediate acceleration power supply 14. The intermediate electrode 9b of the second bi-potential lens 9 is connected to the cathode of a voltage-adjustable objective lens power supply 15. The exit electrode 9c is grounded, so that no electrical field is formed between the exit electrode 9c and the transmissive photomask P, which is also grounded. The entrance electrodes 8a, 9a, intermediate electrodes 8b, 9b, and exit electrodes 8c, 9c have concentric through holes 8d, 9d through which the incident ion beam B can pass.

Different voltages may be applied to these bi-potential lenses at their entrance electrodes 8a, 9a, intermediate electrodes 8b, 9b, and exit electrodes 8c, 9c to form electric fields thereacross. Then, thus formed electric fields allow the ion beam B passing through the through holes 8d, 9d to be converged (diverged). The potential differences between the acceleration voltage E and the voltages at the exit electrodes 8c, 9c allow the ion beam B passing through the through holes 8d, 9d to be accelerated (decelerated). That is, the ion beam B, which is positive ions (Ga$^+$) incident on the bi-potential lenses, can be accelerated or decelerated to adjust its energy and effectively converged with reduced aberrations.

As shown in FIG. 1, the ion beam apparatus 1 further includes, in the intermediate acceleration tube 13, a blanking electrode 16 that turns the irradiation ion beam B on and off, an alignment electrode 17 that rectifies displacement of the optical axis of the ion beam B, and an astigmatism corrector 18 that corrects distortion of the cross section of the ion beam B into a perfectly circular cross section. The blanking electrode 16 is connected to a blanking power supply 19, which may apply a voltage to the blanking electrode 16 to deflect the ion beam B passing therethrough such that the ion beam B does not reach the transmissive photomask P. The alignment electrode 17 is connected to an alignment power supply 20, which may apply a voltage to the alignment electrode 17 to form an electric field, allowing rectification of the optical axis of the ion beam B passing therethrough. The astigmatism corrector 18 is connected to an astigmatism corrector power supply 21, which may apply a voltage to the astigmatism corrector 18 to form an electric field, allowing correction of distortion of the cross section of the ion beam B passing therethrough. The ion beam apparatus 1 further includes a scanning electrode 22 between the second bi-potential lens 9 and the transmissive photomask P. The scanning electrode 22 is connected to a scanning power supply 23. By manipulating the voltage of the scanning power supply 23, it is possible to adjust the position of the ion beam B passing through the scanning electrode 22 at which the transmissive photomask P is irradiated.

Furthermore, a gas gun 25 is provided in the vicinity of the surface S of the transmissive photomask P. The gas gun 25 sprays an assist gas 24 onto a repair location P3 that is a process position on the light-blocking layer P2 on the surface S of the transmissive photomask P. More specifically, the assist gas 24 is a halogen gas, such as fluorine, chlorine, bromine and iodine, or a gas containing a halogen gas, or a nitrogen oxide-based gas. As shown in FIG. 3, such an assist gas 24 can facilitate scraping at the repair location P3 when the repair location P3 is irradiated with the ion beam B. Although not shown in the figure, a secondary electron detector or secondary ion detector that detects secondary electrons or secondary ions generated upon irradiation of the ion beam B on the repair location P3 may be provided in the vicinity of the surface S of the transmissive photomask P. The secondary electron detector or secondary ion detector allows observation of the state of the surface S of the transmissive photomask P when irradiated with the ion beam B.

A repair process using the focused ion beam apparatus 1 to apply the ion beam B to the repair location P3 of the light-blocking layer P2 of the transmissive photomask P will be described. Firstly, as shown in FIG. 1, the voltages of the power supplies in the focused ion beam apparatus 1 are set such that the ion beam B is applied at a predetermined energy level. For example, it is assumed here that the acceleration voltage E of the acceleration power supply is 10 kV; the voltage of the drawing power supply is 6 kV; the voltage of the condenser lens power supply is 20 kV; the voltage of the intermediate acceleration power supply is 10 kV; and the voltage of the objective lens power supply is 20 kV, resulting in +10 kV on the ion supply 3, +4 kV on the entrance electrode 8a, −20 kV on the intermediate electrode 8b, and −10 kV on the exit electrode 8c of the first bi-potential lens 8, and −10 kV on the entrance electrode 9a, and −20 kV on the intermediate electrode 8b of the second bi-potential lens 9. That is, the ion beam B is accelerated to the energy level of 20 keV in the first bi-potential lens 8 and decelerated and focused in the second bi-potential lens 9. Then, the ion beam B is applied to the repair location P3 of the transmissive photomask P at a low energy level of 10 keV according to the acceleration voltage E (=10 kV) set by the acceleration power supply 7. To process the transmissive photomask P, the energy level of the ion beam B during irradiation can be adjusted in a range greater than or equal to 1 keV by setting the acceleration voltage E. As shown in FIG. 3, the repair location P3 can be scraped at a minimum amount of irradiation of the ion beam B in conjunction with the facilitating effect of the assist gas 24. In this process, ions of the ion beam B penetrate into the transmissive layer P1 under the repair location P3 to form a damaged portion P4.

FIG. 4 shows calculated results illustrating the relationship between the depth Z (nm) from the surface S of the transmissive photomask P and the concentration of the gallium (Ga) penetrated therein (ions/cm$^3$) for each case where the acceleration voltage E (the energy level of the ion beam B) is set to 5 kV, 10 kV, 20 kV and 30 kV. It is seen in FIG. 4 that lower energy level of the ion beam B reduces both the maximum depth of gallium ion penetration and the depth at which the ion concentration has a peak value. In particular, the values of these depths substantially change when the acceleration voltage E is less than 20 kV (the energy level of the ion beam B is less than 20 keV), and this tendency becomes more pronounced when the acceleration voltage E is less than 10 kV (the energy level of the ion beam B is less than 10 keV). That is, by reducing the energy level of the ion beam B, the damaged portion P4 may not reach a deeper part of the transmissive photomask P.

FIG. 5 shows a relationship between the acceleration voltage E when the transmissive photomask P is irradiated with the ion beam B to repair the repair location P3 and the transmittance of the repaired transmissive photomask P when irradiated with laser light with a wavelength of 193 nm (ArF) for each case where the acceleration voltage E (the energy level of the ion beam B) is set to 5 kV, 10 kV, 20 kV and 30 kV. The number of scans of the ion beam B is ten, which is within the standard operating range shown in FIG. 7. In the figure, there is also provided transmittance of the transmissive photomask P after a washing process in which the damaged portion P4 of the repaired transmissive photomask P is washed and removed. More specifically, the washing process is carried out with water-dominant washing liquid, dry ice, or ashing. Before washing, change in the acceleration voltage E does not substantially change the transmittance, as shown in FIG. 5. This is because although the reduced acceleration voltage E reduces the depth Z of the damaged portion P4, the gallium concentration increases accordingly, so that the amount of gallium ions penetrated remains unchanged, as shown in FIG. 4. On the other hand, after washing, it is seen in FIG. 5 that the transmittance recovers when the acceleration voltage E is less than 20 kV (the energy level of the ion beam B is less than 20 keV), and this tendency becomes more pronounced when the acceleration voltage E is less than or equal to 10 kV (the energy level of the ion beam B is less than or equal to 10 keV). This is because reduced acceleration voltage E reduces the depth Z of damaged portion P4, as shown in FIG. 4, ensuring that the damaged portion P4 is removed by the washing process. In this example, the measured depth Z of the removed damaged portion P4 was 15 nm or smaller.

As described above, in repairing the transmissive photomask P, the depth Z of the damaged portion P4 can be reduced by setting the energy level of the ion beam B to be applied to the repair location P3 to at least 1 keV but less than 20 keV, at which level the focused ion beam apparatus 1 can apply the ion beam B. Then, by reliably removing the damaged portion P4 in the washing process, the transmittance of the transmissive photomask P can be improved even when irradiated with shorter-wavelength laser light, such as laser light with a wavelength less than 248 nm. This is particularly effective when using irradiation light with a wavelength of from 193 nm, which is the wavelength of laser light emitted from a medium made of ArF, through 13.5 nm, which is the wavelength of laser light from a laser plasma as light source. The fact that photolithography using irradiation light with a short wavelength can be applied to a repaired transmissive photomask improves the transferable linewidth onto a wafer from about 90 nm at the conventional 248 nm wavelength to 90 nm or smaller, particularly, in a range of not less than 22 nm nor more than 65 nm. That is, a repaired transmissive mask can be used in the transfer process even in ArF immersion lithography and EUV lithography. Moreover, the depth Z of the damaged portion P4 to be removed can be 15 nm, which is smaller than conventionally achievable, that is, 25 nm or greater, allowing the phase change of applied laser light to be minimized. This prevents reduction in laser light intensity due to phase difference-based mutual interference when a phase-effect mask is used.

Second Embodiment

Figure 6:
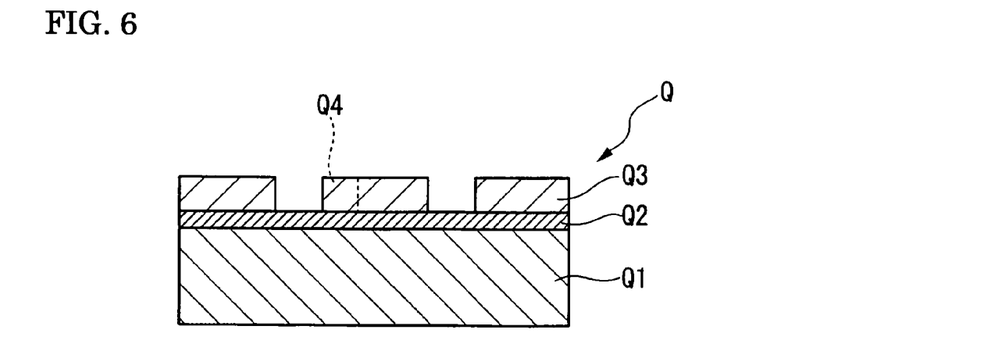
FIG. 6 is a cross-sectional view of the reflective photomask according to the second embodiment of the invention.

FIG. 6 shows a second embodiment according to the invention and is a cross-sectional view of a reflective mask. In this embodiment, members common to those used in the above embodiment have the same characters and the description thereof will be omitted.

As shown in FIG. 6, the reflective mask Q includes a reflective layer Q1 that reflects irradiation laser light (irradiation light), an interference layer Q2 formed on the reflective layer Q1, and an absorption layer Q3 that is patterned on the interference layer Q2 and absorbs the irradiation laser light. More specifically, the reflective layer Q1 is a stacked structure of a plurality of layers made of silicon and a plurality of layers made of molybdenum. The interference layer Q2 is made of, for example, chromium. The absorption layer Q3 is made of, for example, a tantalum-based compound.

In such a reflective mask Q, the repair location Q4 (process position) of the patterned absorption layer Q3 can also be irradiated with the focused ion beam B for repair. As in the first embodiment, by applying the ion beam B at an energy level less than 20 keV, the repair location Q4 is scraped while ions of the ion beam B penetrate into the underlying layer of the absorption layer Q3. In this case, however, the penetration depth can be limited up to the depth of the interference layer Q2. Thus, after repair, the interference layer Q2 can be removed by dry etching in the washing process, resulting in the exposed reflective layer Q1 without a damaged portion formed therein. Such a reflective mask Q is effective in the transfer process using irradiation light with a wavelength less than 248 nm, in particular, in the transfer process using irradiation light with a wavelength of not less than 13.5 nm nor more than 193 nm described above. Similarly, as described above, a repaired reflective mask can be used in the transfer process even in ArF immersion lithography and EUV lithography.

Although embodiments of the invention have been described in detail with reference to the drawings, specific configurations are not limited to these embodiments but include those modified in terms of design without departing from the spirit of the invention.

Although the ion beam B applied to the workpiece is of gallium ions ($Ga^+$), it is not limited thereto. For example, not only cations, such as rare gas (Ar) and alkali metal (Cs) but also anions may be used. Although the transmissive photomask P and reflective mask Q have been used as examples of workpiece to which the ion beam B is applied, the workpiece is not limited thereto, but various microstructures can be processed in a similar manner. For example, when an X-ray mask is used, a similar advantage may be provided. Although in the above description, the focused ion beam apparatus 1 applies the ion beam to the workpiece at a predetermined energy level, the apparatus is not limited thereto, but may be any apparatus capable of focusing and applying an ion beam having an energy level of at least 20 keV or smaller.

What is claimed is:

1. A focused ion beam processing method comprising the steps of:

generating an acceleration voltage between an ion source and a workpiece;

focusing an ion beam emitted from the ion source and applying the ion beam to a predetermined portion to be processed on the surface of the workpiece, wherein the workpiece is a reflective mask that includes a reflective layer, an interference layer on the reflective layer and an absorption layer patterned on the interference layer, and reflects and transfers irradiation light applied to portions other than the portions on which the absorption layer is patterned, and the absorption layer is repaired.

2. The focused ion beam processing method according to claim 1, wherein while the ion beam is applied to the predetermined portion, an assist gas is sprayed thereto.

3. The focused ion beam processing method according to claim 1, wherein the method further comprises the step of, after the predetermined portion is irradiated with the ion beam, washing a damaged portion of the workpiece into which ions of the ion beam has penetrated.

4. The focused ion beam processing method according to claim 1, wherein the workpiece is a transmissive photomask that includes a transmissive layer and a light-blocking layer patterned on the transmissive layer, and transmits and transfers irradiation light applied to portions other than the portions on which the light-blocking layer is patterned, and the light-blocking layer is repaired.

5. The focused ion beam processing method according to claim 4, wherein the wavelength of the irradiation light with which the workpiece is irradiated and transferred is from at least 13.5 nm to less than 248 nm.

6. A focused ion beam processing method comprising the steps of:
 generating an acceleration voltage between an ion source and a workpiece;
 focusing an ion beam emitted from the ion source and applying the ion beam to a predetermined portion to be processed on the surface of the workpiece,
 wherein the energy level of the ion beam produced by the acceleration voltage is set within a range from at least 1 keV to less than 20 keV, and
 wherein the workpiece is a reflective mask that includes a reflective layer, an interference layer on the reflective layer and an absorption layer patterned on the interference layer, and reflects and transfers irradiation light applied to portions other than the portions on which the absorption layer is patterned, and the absorption layer is repaired.

7. The focused ion beam processing method according to claim 6, wherein while the ion beam is applied to the predetermined portion, an assist gas is sprayed thereto.

8. The focused ion beam processing method according to claim 6, wherein the method further comprises the step of, after the predetermined portion is irradiated with the ion beam, washing a damaged portion of the workpiece into which ions of the ion beam has penetrated.

9. The focused ion beam processing method according to claim 6, wherein the workpiece is a transmissive photomask that includes a transmissive layer and a light-blocking layer patterned on the transmissive layer, and transmits and transfers irradiation light applied to portions other than the portions on which the light-blocking layer is patterned, and the light-blocking layer is repaired.

10. The focused ion beam processing method according to claim 9, wherein the wavelength of the irradiation light with which the workpiece is irradiated and transferred is from at least 13.5 nm to less than 248 nm.

* * * * *